United States Patent [19]

Breuninger

[11] Patent Number: 4,929,850
[45] Date of Patent: May 29, 1990

[54] METASTABLE RESISTANT FLIP-FLOP

[75] Inventor: Robert K. Breuninger, Garland, Tex.

[73] Assignee: Texas Instruments Incorporated, Dallas, Tex.

[21] Appl. No.: 98,093

[22] Filed: Sep. 17, 1987

[51] Int. Cl.⁵ .................... H03K 3/284; H03K 17/16
[52] U.S. Cl. ................... 307/272.1; 307/443; 307/291; 307/269; 307/480; 328/63; 328/34
[58] Field of Search ............ 307/443, 272.3, 442, 307/291, 269, 480, 296.1, 296.4; 328/201, 206, 164, 63, 34; 371/61, 47; 375/106, 108

[56] References Cited

U.S. PATENT DOCUMENTS

| | | | |
|---|---|---|---|
| 3,947,697 | 3/1976 | Archer et al. | 307/269 |
| 4,498,176 | 2/1985 | Wagner | 307/269 |
| 4,575,644 | 3/1986 | Leslie | 307/272.1 |
| 4,745,302 | 5/1988 | Hanawa et al. | 307/480 |

Primary Examiner—Stanley D. Miller
Assistant Examiner—Richard Roseen
Attorney, Agent, or Firm—Thomas R. FitzGerald; Leo N. Heiting; Melvin Sharp

[57] ABSTRACT

A flip-flop circuit has two D type flip-flops. A common system clock drives both flip-flops. A stream of asynchronous data is connected to the data input of the first flip-flop FF1. The output of FF1 is connected to the data input of the second flip-flop FF2. The timing characteristics of FF1 and FF2 are chosen so that the time from the clock pulse to the high logic output of FF1 plus the set up time of FF2 is less than the minimum propagation delay time of FF2.

5 Claims, 3 Drawing Sheets

METASTABLE RESISTANT FLIP-FLOP

TECHNICAL FIELD OF THE INVENTION

This invention pertains in general to flip-flops and more particularly to a flip-flop circuit with superior metastable characteristics.

BACKGROUND OF THE INVENTION

Flip-flops are often used by system designers to synchronize signals operating at different frequencies to a local clock. However, since the signals are asynchronous to the local clock, the setup and hold time specifications associated with the flip-flop are sure to be violated. When the setup and hold time is violated, the output response of the flip-flop is uncertain. The output may assume a "metastable" state, defined as the time period during which the output of a digital logic device is not at logic level 1 or logic level 0, but instead resides at an output level between logic level 0 and logic level 1. The voltage ranges corresponding to different logic levels are specified by the manufacturer of the device. For bipolar TTL technology, for example, the metastable region might lie between 0.8 volts and 2.0 volts.

The metastable problem occurs when the signal being input to the flip-flop is undergoing a transition from one logic level to the other simultaneously with the active edge of the local clock pulse, causing the latch section of the flip-flop to latch at the intermediate voltage level. Since the input data is changing while it is being clocked, the system designer does not care if the flip-flop goes to either a high or low logic level in this instance, just so long as the output does not "hang-up" in the metastable region. Eventually, the output of the flip-flop will stabilize at a valid logic level; however, logic circuitry following the flip-flop depends upon the delay specification (stated time period from the clock pulse to a valid output) being met. A metastable output may cause this logic circuitry to fail. Thus, the metastable characteristics of the flip-flop used to synchronize an asynchronous data stream can influence overall system reliability.

One attempt to mitigate the problem of metastable outputs is to provide a second flip-flop in series with the first flip-flop. The clock to the second flip-flop is delayed relative to clock to the first flip-flop, thus allowing time for the output signal of the first flip-flop to stabilize at a valid logic level before clocking the data into the second flip-flop. Using a dual flip-flop system, the delay from input-to-valid output includes the delay through each of the flip-flops, plus the delay between the clocks to the flip-flops. In many applications, this delay is excessive. Furthermore, the logic may still fail if the output of the first flip-flop remains in the metastable region for a period greater than the delay between the clocks.

Therefore, a need has arisen for a flip-flop circuit which reduces the probability of metastable outputs, without introducing excessive delays, and is adapted for implementation in a single, integrated circuit.

SUMMARY OF THE INVENTION

The present invention disclosed and claimed herein describes a method and apparatus for resisting or minimizing the likelihood of occurrence of metastable outputs in a flip-flop circuit, in particular in a circuit used to synchronize an asynchronous data input.

The invention is based on a circuit concept that the probability of two flip-flops going into the metastable state is much lower than the probability of one device going into such a state. The probability of a flip-flop going into the metastable state is directly related to the speed of the flip-flop. The inventive circuit uses two or more flip-flops cascaded. The circuit may be fabricated using discrete devices or integrated into a single device.

In the preferred embodiment, the first flip-flop is chosen to act as fast as possible. Such speed, in itself, reduces the possibility of the flip-flop entering a metastable state. The second flip-flop may be as fast as or slower than the first. There is a special timing relationship between the two flip-flops. The invention provides that the propagation time of the first flip-flop input to its high output level plus the set up time of the second flip-flop must be less than the minimum propagation delay time of the clock between the clock input to the first flip-flop and the clock input to the second flip-flop.

BRIEF DESCRIPTION OF THE DRAWINGS

For a more complete understanding of the present invention and the advantages thereof, reference is now made to the following description taken in conjunction with the accompanying drawings in which.

DETAILED DESCRIPTION OF THE INVENTION

The preferred embodiment of the present invention is best understood by referring to FIGS. 1–4 of the drawings, like numerals being used for like and corresponding parts of the various drawings.

Figure 1:
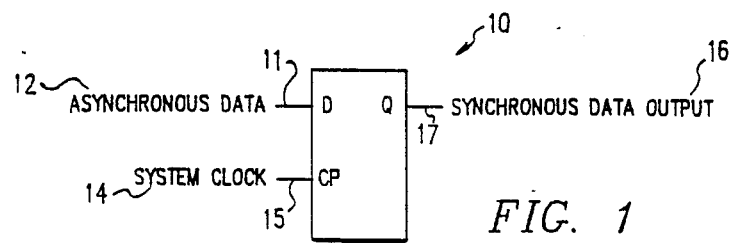
FIG. 1 illustrates a D flip-flop being used to synchronize an asynchronous data stream.

FIG. 1 illustrates the use of a D flip-flop to synchronize an asynchronous data stream. A D flip-flop 10 has a data input 11 receiving an asynchronous data stream 12. The output of a system clock 14 is also received by the clock input 15 of the D flip-flop 10. A synchronous data output 16 is transmitted from the output 17.

In operation, the output 16 of the D flip-flop 10 is equal to the value of the asynchronous data stream 12 at the beginning of the clock pulse. In other words, the D flip-flop 10 outputs a synchronous data output 16 which is equal to the asynchronous data stream 12 sampled at the system clock rate. The output of the D flip-flop 10 is valid after a specified propagation time delay from the active edge of the clock pulse.

Figure 2A:
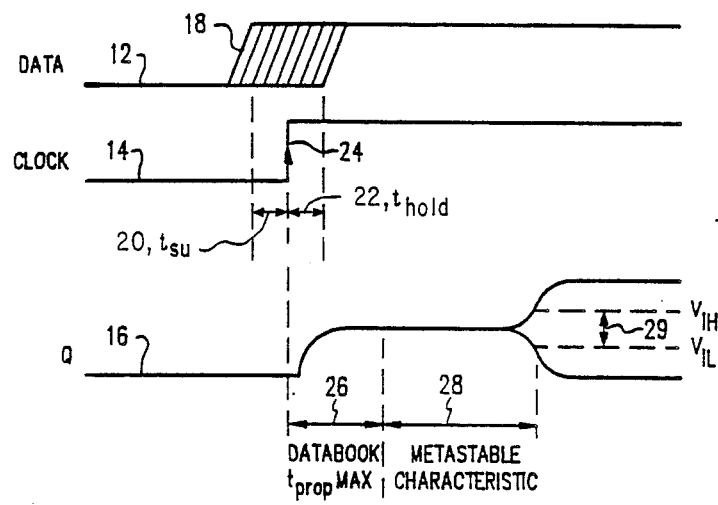
FIG. 2a–c illustrate timing diagrams of conditions under which a metastable output may occur.
Figure 2B:
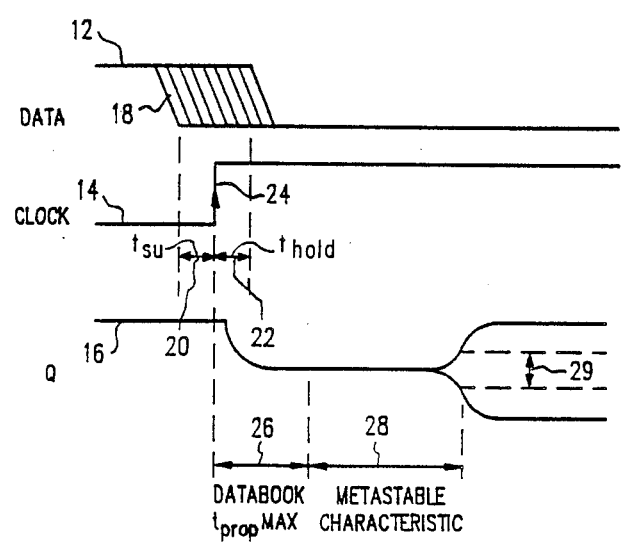
Figure 2C:
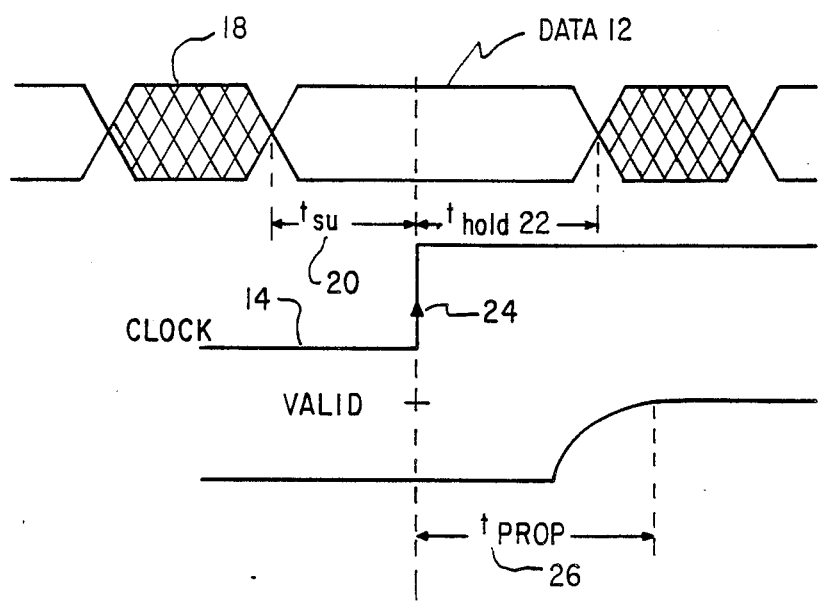

Referring now to FIG. 2a–c, the problem of metastability is illustrated. The metastability problem occurs when the asynchronous data stream 12 is undergoing a transition between two logic levels concurrently with the active edge of the system clock 14. As shown in FIG. 2a, the data stream is undergoing a logic low to logic high transition. The shaded region 18 is jitter and represents the time period during which the asynchronous data stream 12 has not settled into a valid logic level. In order to ensure a valid output, the input data must be stable at a valid logic level for a time period represented by the setup time 20 and hold time 22 requirements. The setup time requirement 20 represents the time period to the active edge of the clock pulse 24 during which the input data should be stable at a valid logic level. The hold time 22 represents the time period during which the input data must remain stable after the active edge of the clock pulse 24. The propagation delay 26 is the time that occurs between the clock transition and an output change caused by that transition.

The setup, hold and propagation times for a stable system are shown in FIG. 2c and will be discussed later.

If the input data is not stable between the setup and hold times 20 and 22, the value of the output 16 is uncertain. While the output 16 may lock into a logical high or logical low value, it may also "hang up" at a voltage in the metastable region which is neither a logical high or a logical low. Under conditions in which the setup and hold requirements 20 and 22 are met, a valid output will appear after a propagation time delay 26. See FIG. 2c. However, if the output hangs up in the metastable region, an additional metastable time delay 28 is necessary before the output 16 assumes a valid logic level. It should be noted that since asynchronous data stream 12 is being sampled at a point between logic levels, either a logical high or logical low output is valid. It should also be noted that while the metastable time delay characteristic represents a time during which most metastable signals will lock into either a high or low logic level in most cases, it would still be possible for the output to hang up for periods greater than the metastable time delay 28.

FIG. 2b illustrates a signal which violates the setup and hold requirements during a logic high to logic low transition. Once again, when the setup time requirement 20 and the hold time requirement 22 are not met, the output 16 may enter the metastable region. In most cases, the output 16 will lock into either a logic high or logic low level within a time indicated by the propagation time delay 26 and the metastable time delay 28.

As mentioned above, metastability may occur when data 12 is in transition. In that case, jitter 18 may be present during either the setup time 20 of hold time 22. FIG. 2c indicates a stable situation where no jitter 18 is present during either the setup time 20 or the hole time 22. Note that in FIG. 2c there is no metastable delay 28 as shown in prior FIGS. 2a and 2b. The setup, hold and propagation times 20, 24 and 26 of any flip-flop are measurable characteristics, are relatively constant for a given family of flip-flops, and are usually found in the published specifications of the flip-flop manufacturer.

Figure 3:
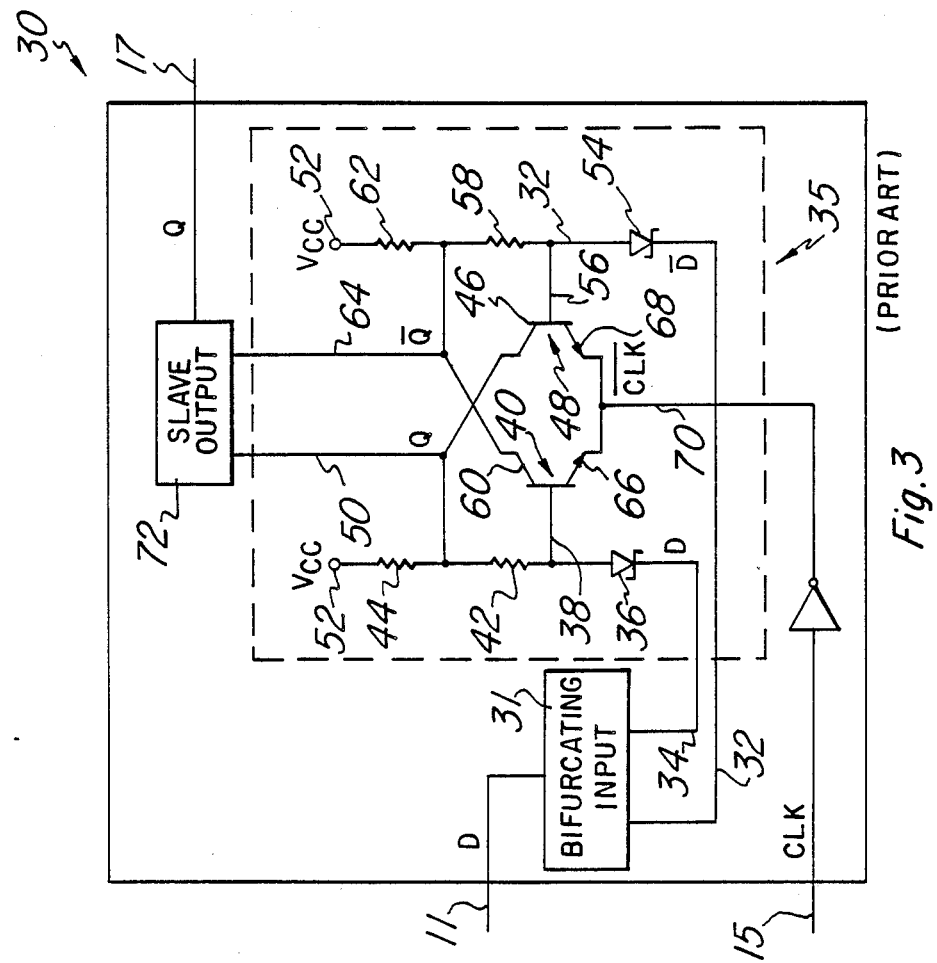
FIG. 3 illustrates a previously developed implementation of a flip-flop.

FIG. 3 illustrates a previously developed flip-flop circuit 30. The input 11 is connected to a bifurcating input section 31 which produces an inverted input 32 and non-inverted input 34, which are connected to a master section 35. The non-inverted input 34 is connected to the cathode of a first diode 36. The anode of the first diode 36 is connected to the base 38 of a first transistor 40 and to a resistor 42. The other lead of the resistor 42 is connected to a pullup resistor 44, the collector 46 of a second transistor 48, and a non-inverting output 50. The other lead of the pullup resistor 44 is connected tot he power supply voltage, $V_{cc}$ 52.

The inverting input 32 is connected to the cathode of a second diode 54. The anode of the second diode 54 is connected to the base 56 of the second transistor 48 and to a resistor 58. The other lead of the resistor 58 is connected to the collector 60 of the transistor 40, to a pullup resistor 62 and to an inverting output 64. The other lead of the pullup resistor 62 is connected $V_{cc}$ 52.

The emitters 66 and 68 of the transistors 40 and 48, respectively, are connected to an inverted clock 70, which is the inverted signal of the system clock 14. The non-inverted output 50 and inverted output 64 are connected to a slave output section 72. The system clock 14 is inverted in order to produce a falling edge in response to the active edge of the system clock. If the flip-flop is designed such that the falling edge is the active edge, no such inversion is necessary.

The master section 35 comprises a latching circuit for locking in the values of the inverted and non-inverted inputs 32 and 34 at the time of the clock pulse.

The slave output section 72 prevents false outputs from occurring when the inverted clock 70 is in a high state, by latching the outputs 50 and 64 at valid states. The slave output section can be implemented using two nand gates, each having the output of the other as one input. The other input is supplied by the outputs 50 and 64 of the master section 35.

The resistor combinations 42 and 44, and 58 and 62, are proportioned to divide the power supply voltage in a desired ratio. The resistors 42 and 58 should not be so large as to prevent the collectors 46 and 60 from drawing current therethrough.

Under normal operating conditions, wherein the setup and hold time requirements are met, the input from the asynchronous data stream 12 is bifurcated into an inverted input 32 and a non-inverted input 34. Assuming, for illustration, that the input has a value of a logical 1, then the non-inverted input 34 has a logical high voltage and the inverted input 32 has a logic low voltage. Hence, the voltage at the base 38 of the first transistor 40 is substantially higher than the voltage at the base 56 of the second transistor 48. As the inverted clock signal 70 changes from a high to a low voltage, the first transistor 40 turns on when the voltage differential between the base 38 and the inverted clock signal 70 exceeds the base-emitter threshold voltage, $V_{be}$, of about 0.7 volts. Hence, if the base 38 is at 3.8 volts, the transistor 40 will turn on when the inverted clock 70 is at a voltage 3.1 volts. The transistor 40 will conduct from collector 60 to emitter 66, drawing current away from the base 56 of the transistor 48. Thus, the second transistor 48 is prevented from turning on while the first transistor 40 is conducting.

The metastability problem occurs when the asynchronous data stream is undergoing a transition during the active edge of the system clock signal 14. If the inverted input 32 and non-inverted input 34 have an equal voltage as the inverted clock signal 70 is decreasing, it is possible that both transistors 40 and 48 will turn on simultaneously. For example, if the bases 38 and 46 both have a voltage of 1.8 volts at precisely the time that the inverted clock signal 70 is at 1.1 volts, then both transistors will conduct simultaneously. Since neither transistor will be able to turn the other off, both inverted and non-inverted outputs 64 and 50 will have the same value, resulting in a metastable output, the transistors 40 and 48 will remain on until the system is perturbed by noise on one of the lines. At that point, one transistor will begin conducting more strongly than the other and will eventually draw enough current form the other transistor so as to turn the other transistor off.

It should be noted that the metastability problem cannot be solved by merely designing one transistor larger than the other. Dissymetry induced prior to the active edge of the clock merely shifts the input conditions which give rise to a metastable output, but do not prevent it. Thus, if the transistors have different sizes, the metastability problem will occur when the inverted and non-inverted inputs 32 and 34 have a particular ratio in relation to the size of the transistors 40 and 48.

Figure 4:
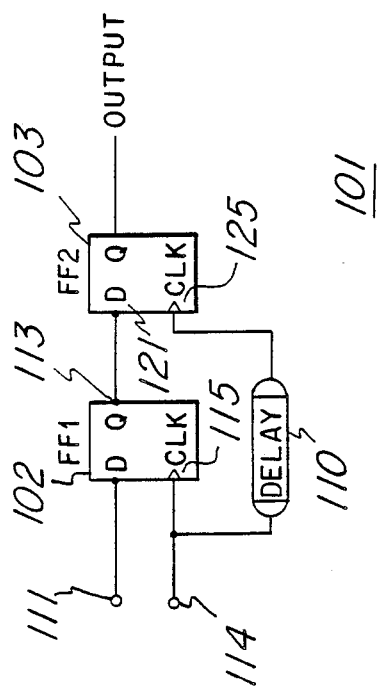
FIG. 4 illustrates the flip-flop circuit of the present invention.
Figure 5:
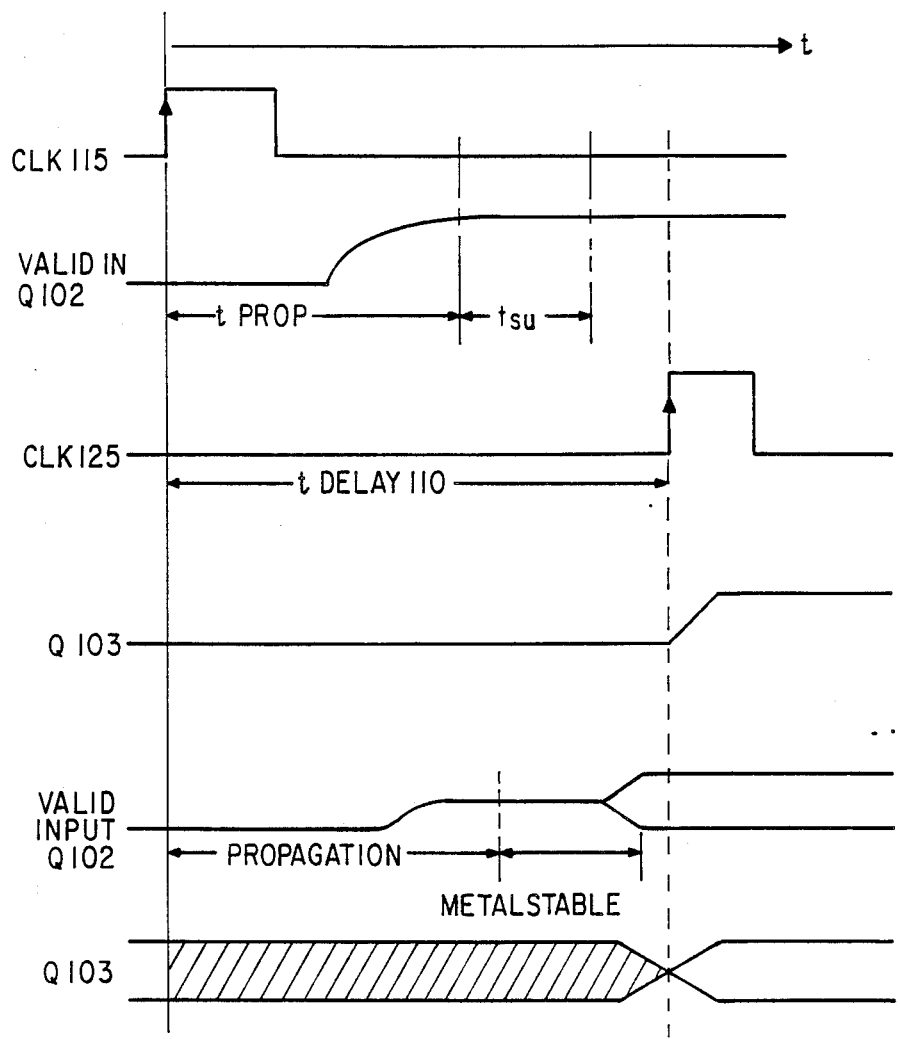

The inventive solution to the problem of metastability is embodied in the circuit 101 of FIG. 4. Circuit 101 has a first D type flip-flop (FF1) 102 and a second D type flip-flop (FF2) 103. A stream of asynchronous data 12 including jitter 18 is input to the input 111 of FF1 102. A system clock 114 is input to the CLK input 115 of FF1 102. The system clock 114 is also connected via delay element 110 to the CLK input 125 of FF2 103. The Q output 113 of FF1 102 is connected to the data input 121 of FF2 103.

There is a delay element 110 represented in the connection between the CLK input 115 of FF1 and CLK input 125 of FF2. This element has a time delay which represents the timing requirements of the circuit 101. In order to reduce the probability of the circuit 101 from entering a metastable state, the operating parameters of FF1 and FF2 are chosen so that the propagation time, t prop, for FF1 to enter its high logic level plus the set up time, $T_{su}$ of FF2 must be less than the minimum propagation delay time of CLK 125 of FF2. This relationship is illustrated in FIG. The latter requirements thus assure that FF1 will have sufficient time to complete its transition between logic levels before FF2 can start such a transition. As such, FF1 and FF2 will never be clocked at the same time. So, even if one of them enters a metastable state, the other will enter a transition at a different time, thereby upsetting the metastable condition of the one.

In operation, the input 121 of FF2 acts like a filter. The input 121 has a very precise threshold voltage. So, even if the output 113 of FF1 is metastable, the input 121 of FF2 will resolve the metastable output of 113 of FF1 into a stable high or low logic level. Hence, the initial metastability of FF1 will be quickly resolved. The probability that FF2 will also be metastable at the exact same time as FF1 is remote. There is little probability that FF2's output will ever be metastable if FF1's output is stable since the input at 121 will not be in jitter or otherwise unstable.

The present invention is applicable to all types of flip-flops, including TTL, ECL, MOS, CMOS, and other technologies, and can be used with other flip-flop configurations, such as R-S flip-flops.

While the present invention has been discussed in connection with a flip-flop, any circuit which uses a latch to lock in data values is subject to metastability problems. Memory cells, flip-flops, registers, discrete latches, and other devices are all subject to the metastability problems which may benefit from the present invention.

Although a preferred embodiment of the invention has been described in detail, it should be understood that various changes, substitutions and alterations can be made therein without departing from the spirit and scope of the invention as defined by the appended claims.

What is claimed is:

1. A circuit comprising: a first flip-flop circuit having, clock and output terminals;

a second flip-flop circuit having input, clock and terminals;

each of said flip-flops having stable high and stable low logic states and each having propagation and set up times;

the output terminal of the first flip-flop connected to the input terminal of the second flip-flop; and a clock delay connected between the first clock terminal and the second clock terminal for delaying a clock input received at the first clock terminal a predetermined time; wherein the sum of the propagation time of the first flip-flop and the set up time of the second flip-flop is less than the clock delay.

2. The circuit of claim 1, wherein the input terminal of the first flip-flop is adapted to receive a digital data signal.

3. The circuit of claim 1 wherein the flip-flop circuits comprise unipolar transistors.

4. The circuit of claim 1 wherein the flip-flop circuits comprise bipolar transistors.

5. A method for reducing the probability of an occurrence of a metastable state in a circuit having first and second flip-flops.

each having stable alternate logic states and each having a propagation time and a setup time and connected in cascade and having a common system clock connected to the first flip-flop said method comprising:

connecting a stream of asynchronous data to a data input of the first flip-flop;

connecting the data output of the first flip-flop to the data input of the second flip-flop;

delaying clocking of the second flip-flop a predetermined time greater than the sum of the propagation time of the first flip-flop and the setup time of the second flip-flop.

* * * * *